United States Patent [19]

Plumb

[11] Patent Number: 4,813,054
[45] Date of Patent: Mar. 14, 1989

[54] DISTRIBUTED FEEDBACK LASER

[75] Inventor: Richard G. S. Plumb, Suffolk, Great Britain

[73] Assignee: STC PLC, London, England

[21] Appl. No.: 67,477

[22] Filed: Jun. 29, 1987

[30] Foreign Application Priority Data

Nov. 8, 1986 [GB] United Kingdom ............ 8626730

[51] Int. Cl.⁴ .............................................. H01S 3/08
[52] U.S. Cl. ........................................ 372/96; 372/45; 372/46; 372/50
[58] Field of Search ................... 372/43–46, 372/50, 96

[56] References Cited

FOREIGN PATENT DOCUMENTS 0123886 9/1979 Japan ..................... 372/46
0078488 5/1983 Japan ..................... 372/96

Primary Examiner—William L. Sikes
Assistant Examiner—Georgia Y. Epps
Attorney, Agent, or Firm—Lee & Smith

[57] ABSTRACT

A distributed feedback (DFB) laser having a divided electrode structure on one surface by means of which the injected current distribution in the laser may be modified so as to enable independent control of laser output amplitude and wavelength.

8 Claims, 5 Drawing Sheets

Fig. 2.
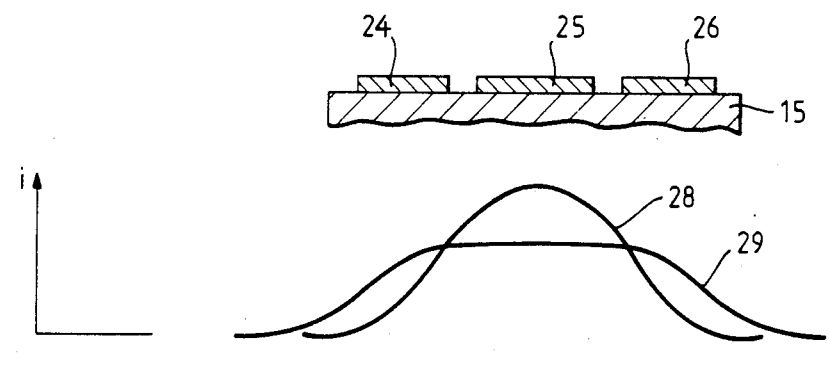
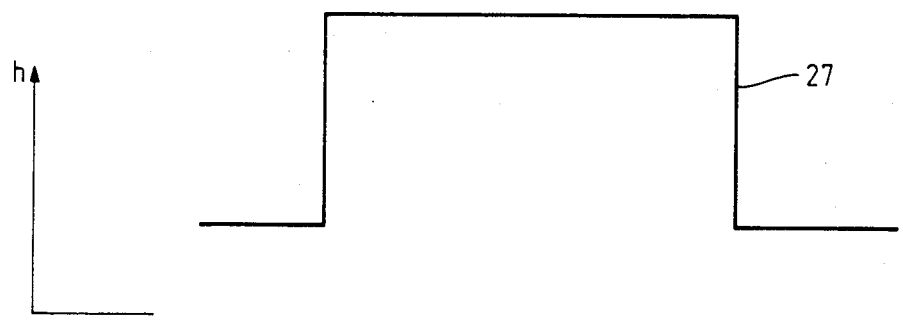
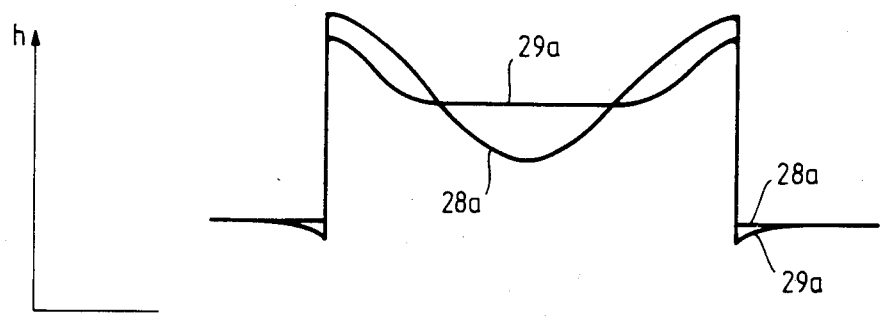

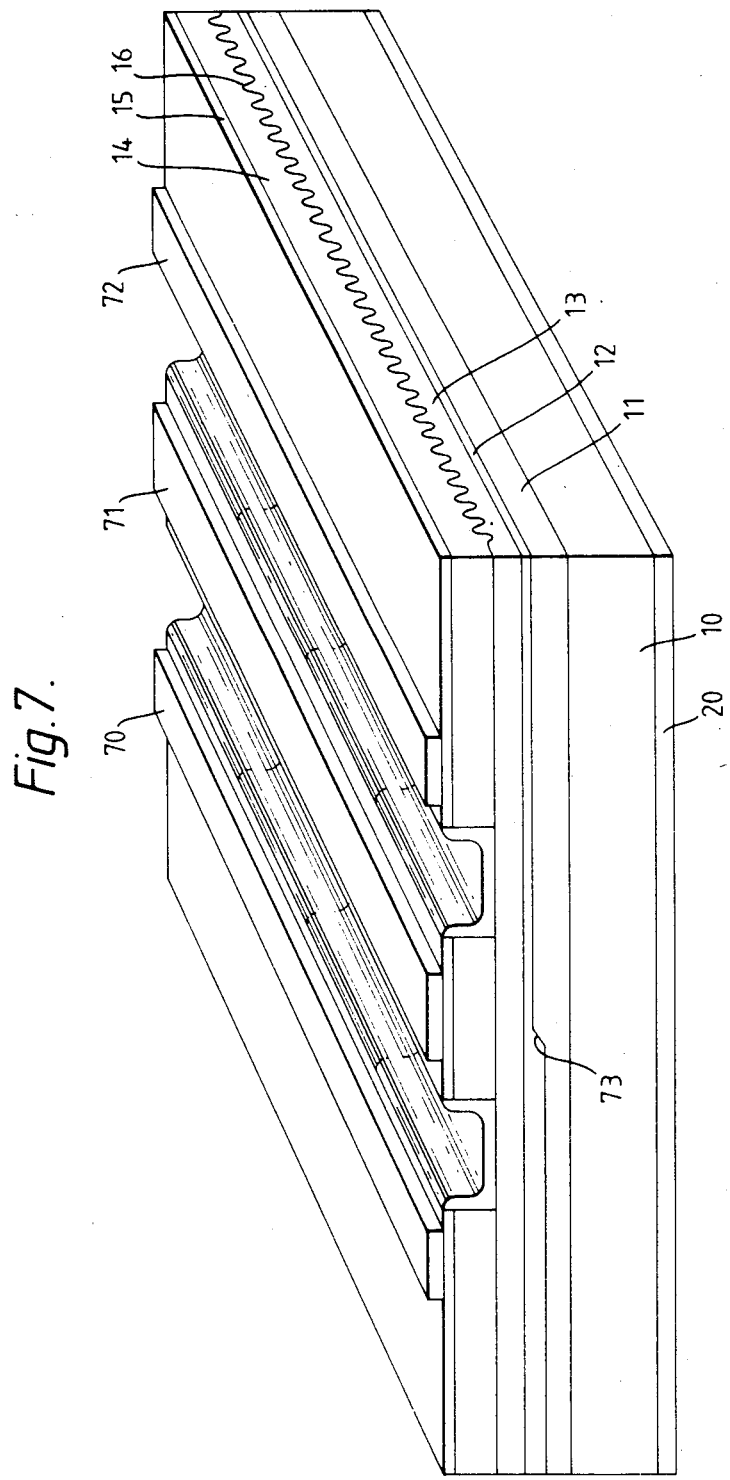

DISTRIBUTED FEEDBACK LASER

BACKGROUND OF THE INVENTION

This invention relates to distributed feedback (DFB) lasers. DFB lasers with nominally identical gratings and waveguides that are derived from the same wafer can typically be expected to have a device to device wavelength scatter of up to about 1 nm. A tuning range of 1 nm is therefore required so that all devices from one wafer can be matched to a fixed local oscillator frequency. When wafer-to-wafer variations in wavelength are considered, a greater tuning range is desirable, preferably about 5 nm, though for a number of applications about 2 nm should suffice.

One method of tuning the output of a DFB laser is described in European Patent Application Specification No. EP 0 169 567 A2 to which attention is directed. The method described therein involves a construction of laser chip in which distributed feedback is provided along only a portion of the whole length of the optical cavity within the chip, that portion extending from one end. At the other end a highly reflecting facet is provided. The emission wavelength is tuneable over a restricted range by adjusting the current drive applied to the region of the optical cavity extending between the highly reflecting facet and the distributed feedback region. Adjustment of this drive affects the refractive index, thereby affecting the phase of light reflected back into the distributed feedback region, and hence the frequency of laser emission.

SUMMARY OF THE INVENTION

The present invention is concerned with an alternative method of tuning DFB lasers embodiments of which are believed intrisically capable of a relatively wider tuning range.

According to the present invention there is provided a distributed feedback (DFB) laser provided with three or more electrodes disposed such that by control of the relative current flow through said electrodes the injected current profile in the distributed feedback region of the laser is adjustable to vary the frequency of the laser output independently of its optical amplitude.

BRIEF DESCRIPTION OF THE DRAWINGS

There follows a description of DFB lasers embodying the invention in preferred forms. The description refers to the accompanying drawings in which:

FIGS. 2 to 8 depict various alternative forms of layout of contacts and distributed feedback gratings.

DETAILED DESCRIPTION OF PREFERRED EMBODIMENTS

Figure 1:
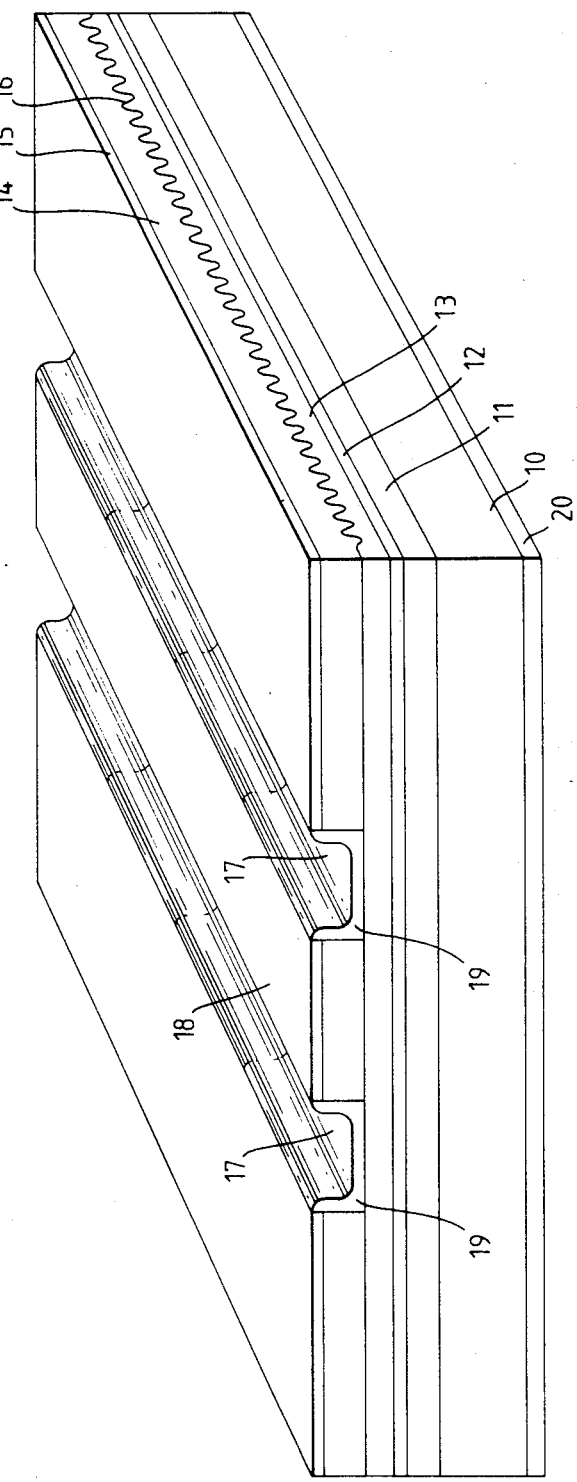
FIG. 1 depicts a laser chip without its top contacts.

Various different structures of DFB laser are possible, thus one known structure has its diffraction grating formed in a layer grown before the growth of the active layer, while in another the grating is formed in a layer grown after the growth of the active layer. By way of example the present invention will be exemplified in particular with reference to a DFB laser structure of this second kind, but it should be clearly understood that the invention is not limited in its application solely to this kind of DFB laser structure. Referring now particularly to FIG. 1, five epitaxial layers 11 to 15 are grown upon an n-type InP substrate 10. Layer 11 is an n-type buffer layer of InP. On layer 11 is grown the active layer of the laser structure, layer 12 which is of quaternary material (InGaAsP) having a composition providing an emission wavelength in the wavelength range from 1.3 to 1.6 $\mu$m. Layer 13 is a layer variously referred to as the anti-meltback layer or as the guide layer, and is formed of p-type InGaAsP of greater band gap than that of active layer 12. Epitaxial growth is temporarily halted at this stage in order to form a diffraction grating 16 in its surface before growth is recommenced to form layer 14, which is of p-type InP and constitutes the p-confining layer, and then to form layer 15 which is a capping layer of InGaAsP or InGaAs. At this stage two channels 17 are etched which descend to the anti-meltback layer 13 and define an intervening stripe 18. These channels 17 are coated or filled with electrically insulating passivation 19. On the capping layer 15, in registry with the channel and ridge structure, are provided two or more physically separated electrical contacts (not shown in FIG. 1). This contrasts with a conventional DFB laser which has only one contact with the capping layer overlying the distributed feedback region. A contact layer 20 is also formed on the under-surface of substrate 10 to form a counter-electrode.

Turning attention now to FIG. 2, the arrangement of contacts on the capping layer 15 of FIG. 1 is such as to provide a longitudinally divided electrode structure with three parallel stripe contacts 24, 25 and 26 registering with the stripe 18 of FIG. 1 (defined by its two channels 17). The material of the stripe 18 has a higher refractive index than that of the material filling the channels 17, and thus the channels co-operate with the stripe to provide a built-in waveguiding structure with an index profile as depicted at 27 in FIG. 2. This index profile forms a built-in waveguide for guiding the laser light within the body of the laser. This profile is however modified by the presence of carriers which have the effect of depressing the refractive index. The effect of the distributed feedback grating upon emission wavelength of the laser is controlled not essentially by the pitch of that grating expressed in terms of physical distance, but rather it is controlled by the pitch expressed in terms of optical path length (the product of physical distance with effective refractive index). Therefore any change of carrier density that produces a change in effective refractive index seen by the laser light will produce an attendant change in emission wavelength.

The provision of the three contacts enables some control over the profile of the injected current. If the current is injected solely through the central one of the three contacts, contact 25, a relatively sharply peaked carrier density profile is produced, as exemplified for instance by curve 28. This modifies the built-in index profile to result in the index profile given by curve 28a. At any particular level of current drive there is produced a particular effective refractive index of the guide and hence a particular wavelength of emission. A change in drive produces a change in carrier density and hence a change in emission wavelength. If however, the current is injected equally through all three contacts 24, 25 and 26, or even preferentially into the outer contacts 24 and 26, a flatter carrier density profile is provided, as exemplified by curve 29. This flatter curve is less disruptive than curve 28 of the waveguiding provided by the built-in waveguide profile 27, and produces the index profile of curve 29a, with the result that the efficiency of laser light generation is greater. In consequence the injected current drive level that produces the same effective refractive index as produced by current injection solely through contact 26, produces a greater optical output, but at the same wavelength. Thus it is possible, while keeping the emission wavelength constant, to raise the output of the laser from a relatively low level, produced relatively inefficiently by a sharply peaked injected carrier profile, through to a relatively high level produced more efficiently by a profile that is less sharply peaked, relatively flat, or even one having a dip in the centre. Alternatively, the same type of adjustment of current drive may be employed to adjust the emission wavelength provided at any given optical output level.

A feature of the laser of FIG. 2 is that it does not suffer from the same type of tuning constraints as the phase tuneable laser of EP 0 169 567 in that in the phase tuneable laser the tuning range is intrinsically limited by mode-hopping considerations. In the phase tuneable laser the natural resonance condition of the distributed feedback portion of the laser is in effect perturbed by the resonance characteristics of the phase-tuning portion. This constrasts with the laser described with particular reference to the present FIG. 2 in which tuning is instead achieved by adjustment of natural resonance condition presented by the distributed feedback structure.

In a modified version (not illustrated) of the laser of FIG. 2, instead of having all three contacts 24, 25 and 26 overlying the stripe 18, only the central contact 25 overlies it, while contacts 24 and 26 are symmetrically disposed on the capping layer just outboard of the two channels 17.

Figure 3:
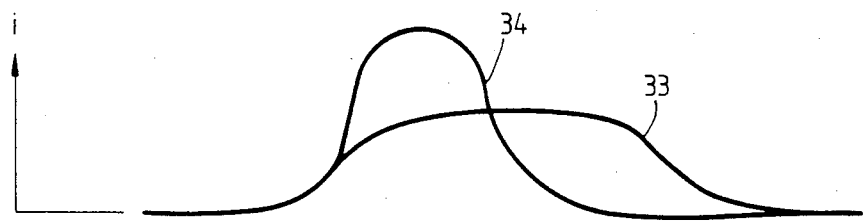

Normally the laser of FIG. 2 will be operated symmetrically and have the outer two contacts 24 and 26 commoned so that equal current is injected into each. FIG. 3 depicts a modified version which has two contacts 31 and 32 in place of the three contacts 24, 25 and 26. With this arrangement symmetric current injection produces an injection carrier density profile of the form given by curve 33, while an asymmetric drive with more current injected into contact 31 produces a profile of the form given by curve 34, and is associated with lower efficiency of laser light generation than the symmetric drive state.

Figure 4:
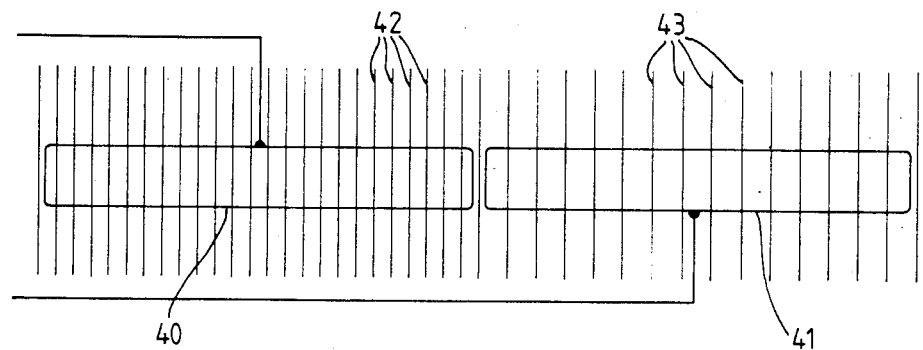

The lasers of FIGS. 2 and 3 have involved the longitudinal division of the top electrode structure, whereas in the laser of FIG. 4 the electrode structure has been divided transversely to provide two contacts 40 and 41. Underlying contact 40 the diffraction grating 16 (FIG. 1) is formed with a certain pitch indicated by the lines 42, while the corresponding portion of the grating 16 underlying contact 41 is formed with a slightly different pitch indicated by the lines 43. (In the drawing the difference in pitch has been greatly exaggerated; in actuality the difference will typically not be more than about 0.05%.) This structure may be considered as comprising two coupled resonators. If current injection is concentrated through contact 40, then the emission of the combination is pulled toward the resonance condition determined by the pitch of lines 42; conversely when the current injection is weighted towards the other end the emission is pulled towards the resonance condition determined by the pitch of lines 43. As one alternative to having the two distinct pitches with an abrupt change of pitch in the middle of the structure, the grating can be graded in pitch from end to end in a single chirp.

Figure 5:
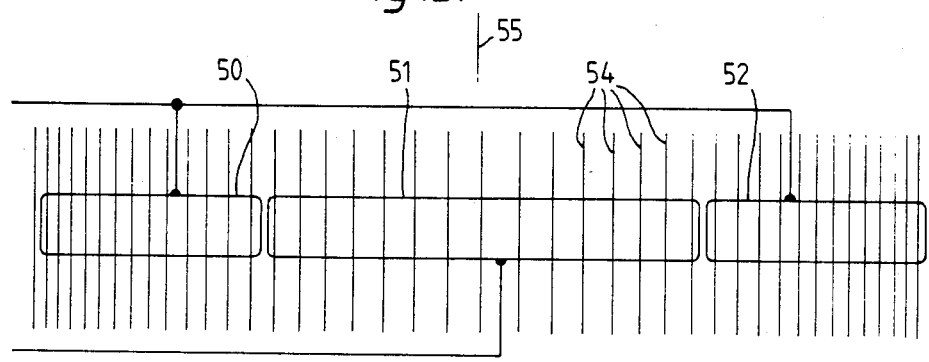

Unlike the lasers of FIGS. 2 and 3, one characteristic of the laser of FIG. 4 is that when tuning from one end of the tuning range to the other the concentration of gain is also shifted from one end to the other, with the result that the distribution of power output between the two ends is also changed. This characteristic is avoided in the laser of FIG. 5 by virtue of its symmetrical layout and drive. This laser is divided transversely to provide three contacts 50, 51 and 52. The arrangement of these contacts, and the grading of the pitch of the distributed feedback grating, as represented by lines 54, are both symmetrical about a centre line 55. If the current injection is concentrated via contact 51 then the emission of the laser is pulled toward the resonance condition determined by the pitch of that portion of the grating underlying this contact, whereas if the injection is concentrated via contacts 50 and 52, which are commoned, then it is the pitch of those portions of the grating under these contacts that is dominant. In the drawing the pitch is shown as continuously graded (with the grading greatly exaggerated); alternatively the changes in pitch can be made stepwise.

Figure 6:
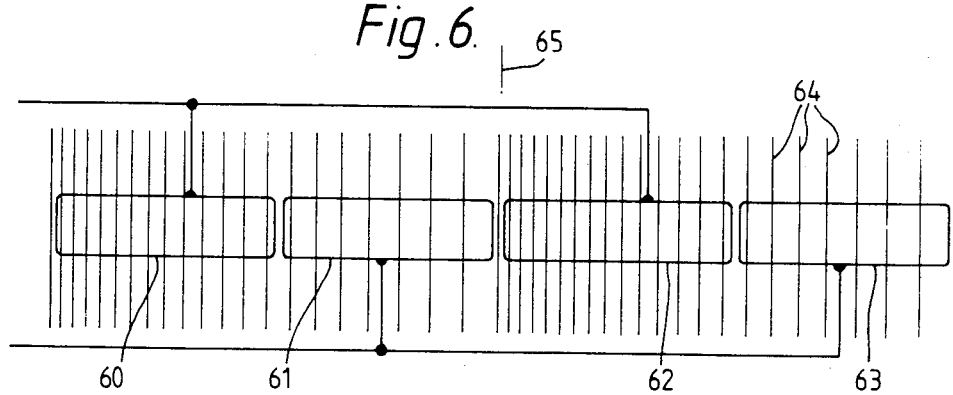

FIG. 6 depicts a further alternative construction of laser with a transversely divided electrode structure. This employs four contacts 60, 61, 62 and 63 in association with an antisymmetric chirp in the pitch of the underlying grating 64. Differential drive is effected between contacts 60 and 62 which are common to and between contacts 61 and 63, which are likewise commoned. The chirp (with grading greatly exaggerated) extending beneath contacts 60 and 61 up to the centre line 65 is repated under contacts 62 and 63. This layout does not have the symmetry of the laser of FIG. 5, and hence the division of power output between the two ends will still vary somewhat over the tuning range, but on the other hand, unlike the laser of FIG. 5, an equivalent length of the chirp will be active at both extremes of the tuning range. Thus circulating power and threshold will not vary as much over the tuning range.

In the case of lasers described with particular reference to FIGS. 2 and 3 a longitudinally divided electrode structure is employed to enable the shape of the current profile to be varied so as to alter the lasing efficiency of the device, and hence permit independent control of output power and wavelength. The laser of FIG. 7 similarly employs a longitudinally divided electrode structure with electrodes 70, 71 and 72, but in this instance the division of the electrodes is provided in order to allow the centre-of-gravity of the injected current, and consequently the optical filament, to be shifted laterally across a region 73 where the propagation constants of the laser change either due to a change in composition which produces a change of refractive index, or due to a change in thickness of at least one of layers 11, 12 or 13 (the buffer layer, the active layer, or the anti-meltback layer). As the centre-of-gravity is slowly transferred from one side of region 73 to the other so the wavelength is progressively shifted from a value determined primarily by the propagation constants of the one side to value determined primarily by the propagation constants of the other.

Figure 8:
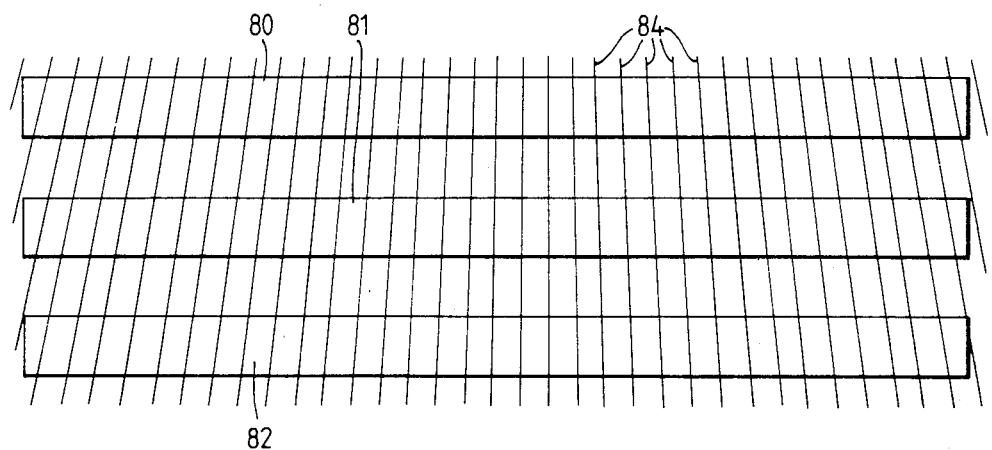

The laser of FIG. 8 similarly relies upon the effects of laterally shifting the centre of gravity of the injected current by means of adjustment of the current between the three electrodes 80, 81 and 82 of a longitudinally divided electrode structure on the capping layer 15 of FIG. 1. In this instance this lateral shift produces a wavelength change because the grating lines 84 are radially arranged instead of being parallel to each other. The waveguide in this case can be straight or it may be curved. With typical waveguide parameters a curvature down to a radius of about 300 μm is satisfactory.

What is claimed is:

1. A distributed feedback (DFB) laser having a semiconductor body including a periodic structure formed to modulate the optical propagation constant of laser light propagating within the laser, the semiconductive body having an outer surface and including at least three electrodes on said surface, one of said electrodes comprising a counter-electrode and the remaining electrodes comprising an electrode structure, said electrodes being arranged such that by control of the relative current flow through said electrodes the injected current profile, in the region of modulated optical propagation constant produced by said periodic structure, is adjustable to vary the frequency of the laser output independently of its optical amplitude.

2. A DFB as claimed in claim 1 wherein said outer surface includes a surface portion having provided thereon said electrode structure extending in the direction of the emission axis of the laser, said electrode structure being longitudinally divided.

3. A DFB laser as claimed in claim 2 wherein the semiconductive body is composed of semiconductive components having different refractive indices and which are configured to provide a real lateral waveguiding effect for the laser light.

4. A DFB laser as claimed in claim 2 wherein the semiconductor body is composed of semiconductive components having different refractive indices and which are configured to provide regions of different optical propagation constant additional to the modulated optical propagation constant produced by the periodic structure, and wherein said longitudinally divided electrode structure has electrically distinct component parts overlying different ones of said regions of different optical propagation constant.

5. A DFB laser as claimed in claim 4 wherein said semiconductive body has at least one layer of non-uniform thickness to provide said regions of different optical propagation constant.

6. A DFB laser as claimed in claim 4 wherein said semiconductive body has at least one layer of non-uniform composition to provide said regions of different optical propagation constant.

7. A DFB laser as claimed in claim 2 wherein the periodic structure that modulates the optical propagation constant of the laser light propagating within the laser is of radial form.

8. A DFB laser as claimed in claim 1 wherein said outer surface includes a surface portion having provided thereon said electrode structure extending in the direction of the emission axis of the laser, which electrode structure is transversely divided, and wherein the periodic structure that modulates the optical propagation constant of the laser light propagating within the laser is of non-uniform periodicity.

* * * * *